United States Patent
Sato et al.

(10) Patent No.: US 12,371,191 B2
(45) Date of Patent: Jul. 29, 2025

(54) METHOD OF PRODUCING STRUCTURE

(71) Applicant: SUBARU CORPORATION, Tokyo (JP)

(72) Inventors: Yoichi Sato, Tokyo (JP); Yutaka Yamagishi, Tokyo (JP); Kazuma Ashizawa, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 18/441,722

(22) Filed: Feb. 14, 2024

(65) Prior Publication Data

US 2024/0278936 A1    Aug. 22, 2024

(30) Foreign Application Priority Data

Feb. 20, 2023  (JP) .................... 2023-024003

(51) Int. Cl.
  B64F 5/10  (2017.01)
  G06F 30/15 (2020.01)
  G06F 30/23 (2020.01)

(52) U.S. Cl.
  CPC .............. B64F 5/10 (2017.01); G06F 30/15 (2020.01); G06F 30/23 (2020.01)

(58) Field of Classification Search
  CPC .............. B64F 5/10; B64F 5/00; G06F 30/15
  See application file for complete search history.

(56) References Cited

U.S. PATENT DOCUMENTS

| 5,385,050 A | * | 1/1995 | Roberts ............ G01B 17/00 33/783 |
| 6,748,346 B2 | | 6/2004 | Ujiie |
| 8,756,792 B2 | | 6/2014 | Boyl-Davis et al. |
| 10,139,808 B2 | | 11/2018 | Engelbart et al. |

(Continued)

FOREIGN PATENT DOCUMENTS

| EP | 2 533 167 A2 | 12/2012 |
| EP | 3 689 751 A1 | 8/2020 |

(Continued)

OTHER PUBLICATIONS

Extended European Search Report mailed Jul. 17, 2024 for European Patent Application No. 24152297.8 (12 pages).

*Primary Examiner* — Michael W Hotchkiss
(74) *Attorney, Agent, or Firm* — Smith, Gambrell & Russell, LLP

(57) ABSTRACT

A method of producing a structure by coupling a first component to a second component and inserting a shim into a gap formed between the first component and the second component includes: measuring first and second profiles of first and second surfaces of the first and second components before completing positioning of the first and second components to coupling positions; measuring third and fourth profiles of third and fourth surfaces of the first and second components before completing the positioning; performing the positioning by butting the first surface against the second surface; measuring fifth and sixth profiles of the third and fourth surfaces after completing the positioning; calculating a size of the gap based on the first to sixth profiles; producing the shim based on the size of the gap; and coupling the second component to the first component with the shim inserted and the positioning completed.

4 Claims, 4 Drawing Sheets

(56) References Cited

U.S. PATENT DOCUMENTS

| | | | |
|---|---|---|---|
| 10,450,053 B2 | 10/2019 | Doyle et al. | |
| 10,562,246 B2* | 2/2020 | Douilly | B33Y 30/00 |
| 11,524,791 B2 | 12/2022 | Tullock et al. | |
| 2012/0316666 A1* | 12/2012 | Boyl-Davis | G05B 19/4099 |
| | | | 700/98 |
| 2014/0303764 A1* | 10/2014 | Boyl-Davis | G06F 30/00 |
| | | | 700/98 |
| 2017/0132355 A1* | 5/2017 | Vasquez | B64C 1/26 |
| 2017/0138385 A1* | 5/2017 | Clark | G06F 30/23 |
| 2018/0067476 A1* | 3/2018 | Engelbart | G06F 30/17 |
| 2019/0205501 A1* | 7/2019 | Vasquez | G06F 30/15 |
| 2019/0236472 A1* | 8/2019 | Kobayashi | G06F 30/17 |
| 2021/0229836 A1* | 7/2021 | Sharples | B25J 9/1669 |
| 2021/0245861 A1* | 8/2021 | Whitmer | F16B 5/02 |
| 2021/0310783 A1* | 10/2021 | Georgeson | B64F 5/60 |
| 2022/0245294 A1* | 8/2022 | Rabiega | G06F 30/15 |

FOREIGN PATENT DOCUMENTS

| | | |
|---|---|---|
| JP | 2000-029922 A | 1/2000 |
| JP | 2018-041439 A | 3/2018 |
| JP | 2018-051751 A | 4/2018 |

* cited by examiner

METHOD OF PRODUCING STRUCTURE

CROSS REFERENCES TO RELATED APPLICATIONS

This application is based upon and claims the benefit of priority from Japanese Patent Application No. 2023-024003, filed on Feb. 20, 2023; the entire contents of which are incorporated herein by reference.

FIELD

Implementations described herein relate generally to a method of producing a structure.

BACKGROUND

An aircraft structure, such as a wing structure, is produced by assembling components. When a gap arises between components due to production error or the like, a shim is inserted to fill the gap (for example, refer to Japanese Patent Application Publication JP2018-051751 A and Japanese Patent Application Publication JP2018-041439 A). In order to produce a shim to fill a gap between components, it is necessary to determine a shape of the shim to be produced. Accordingly, the shape of the shim is determined by directly measuring the gap between the components using a clearance gauge in many cases.

However, when a gap between components is measured using a clearance gauge, it is possible to measure only the gap at end portions of surfaces of the components mated with each other. Therefore, even when the gap is large in a portion other than the end portions of the components, as in a case where the gap is large near the centers of the surfaces of the components mated with each other, it is not possible to know that the gap expands. As a result, there are problems in that a gap may remain between components and a shim may need to be remade when a further gap is discovered after a shim has been inserted.

Accordingly, an object of the present invention is to allow producing a shim having an appropriate shape when a gap arises between components in production of a structure by coupling the components.

SUMMARY

In general, according to one implementation, a method of producing a structure by coupling a first component to a second component and inserting a shim into a gap formed between the first component and the second component includes: measuring a first profile of a first surface of the first component before completing positioning of the first component and the second component to coupling positions of the first component and the second component; measuring a second profile of a second surface of the second component before completing the positioning; measuring a third profile of a third surface of the first component before completing the positioning; measuring a fourth profile of a fourth surface of the second component before completing the positioning; performing the positioning by butting the first surface against the second surface; measuring a fifth profile of the third surface after completing the positioning; measuring a sixth profile of the fourth surface after completing the positioning; calculating a size of the gap based on the measured first to sixth profiles; producing the shim based on the calculated size of the gap; and coupling the second component to the first component in a state where the shim has been inserted into the gap and the positioning has been completed. The structure consists of an aircraft, an aircraft component, a spacecraft or a spacecraft component. The first surface is mated with the second component. The second surface is mated with the first component. The third surface is measurable after completing the positioning. The fourth surface is measurable after completing the positioning.

DETAILED DESCRIPTION

A method of producing a structure according to implementations of the present invention will be described with reference to accompanying drawings.

Figure 1:
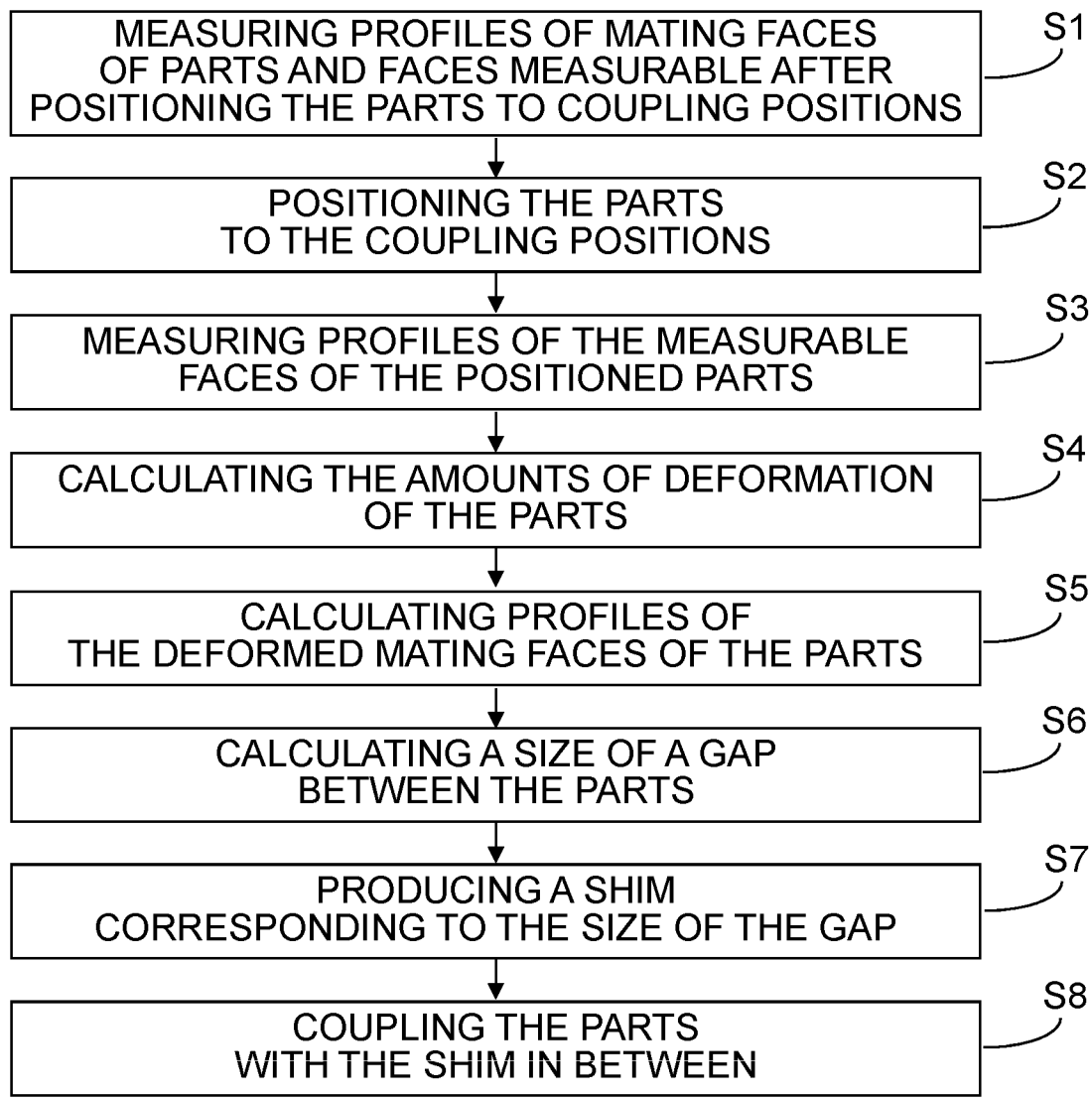
FIG. 1 is a flowchart showing a flow of a method of producing a structure according to an implementation of the present invention.

FIG. 1 is a flowchart showing a flow of a method of producing a structure according to an implementation of the present invention.

The method of producing a structure shown in FIG. 1 can be adopted when the structure is produced by inserting a shim into a gap formed between the first component and the second component to couple them with each other. That is, the structure is produced by assembling at least the first component and the second component, and a shim is inserted into a gap formed between the first component and the second component.

Typical examples of such a structure include an aircraft, an aircraft component, a spacecraft, such as a rocket, and a component of a spacecraft. Therefore, the producing method shown in FIG. 1 can be adopted as a method of producing a structure consisting of an aircraft, an aircraft component, a spacecraft, or a spacecraft component. The aircraft is not limited to a fixed wing aircraft, but may be a rotorcraft, such as a helicopter, a multicopter, a drone or a flying car.

Figure 2:
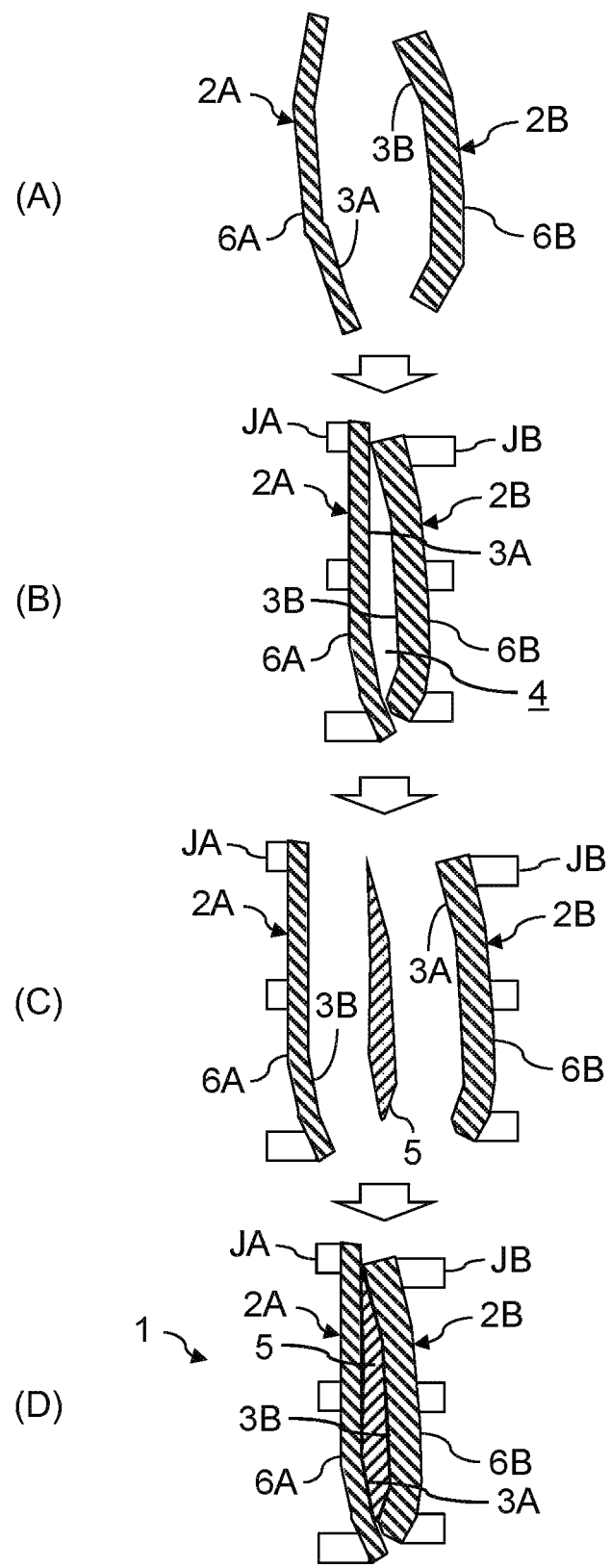
FIG. 2 is a chart schematically explaining an assembly order of a structure to be produced by the producing method shown in FIG. 1.

FIG. 2 is a chart schematically explaining an assembly order of a structure 1 to be produced by the producing method shown in FIG. 1. Note that, the amounts of deformation of a first component 2A and a second component 2B included in the structure 1 have been emphasized in FIG. 2.

The first component 2A and the second component 2B shown in (A) of FIG. 2 can be fixed to assembly jigs JA and JB, respectively, and then can be disposed so that a first mating surface 3A of the first component 2A and a second mating surface 3B of the second component 2B may butt against each other, as shown in (B) of FIG. 2. That is, the first component 2A and the second component 2B can be positioned at assembly positions of the first component 2A and the second component 2B, respectively.

Note that, at least one of the first component 2A and the second component 2B may be temporarily attached to the other component 2A or 2B using clamps or the like without using the assembly jigs JA and JB, or in addition to using the assembly jigs JA and JB. Therefore, the first component 2A and the second component 2B can be positioned using not only positioning structures, such as pins, positioning holes and reference planes, which the assembly jigs JA and JB have, but also at least one positioning structure which the other component 2A or 2B has.

When the positioning of the first component 2A and the second component 2B is completed, the shape of the first component 2A and the shape of the second component 2B are deformed from their initial shapes, respectively, as shown in (B) of FIG. 2. That is, the shape of the first component 2A after the positioning is different from the shape of the first component 2A before the positioning. Similarly, the shape of the second component 2B after the positioning is different from the shape of the second component 2B before the positioning.

Therefore, a gap 4 depending on the shape of the first component 2A after the deformation and the shape of the second component 2B after the deformation is generated between the first mating surface 3A of the first component 2A after the positioning and the second mating surface 3B of the second component 2B after the positioning. The size of the gap 4 is defined by distances between the first mating surface 3A of the first component 2A after the deformation and the second mating surface 3B of the second component 2B after the deformation.

The distances between the first mating surface 3A of the first component 2A after the deformation and the second mating surface 3B of the second component 2B after the deformation are not necessarily the same for each position. Accordingly, the size of the gap 4 can be expressed by widths of a plate-shaped space whose thickness is not constant, more specifically, distances at respective positions between the first mating surface 3A and the second mating surface 3B.

Next, in order to fill the gap 4 generated between the first mating surface 3A of the first component 2A after the deformation due to the positioning and the second mating surface 3B of the second component 2B after the deformation due to the positioning, a shim 5 is produced as shown in (C) of FIG. 2. It is appropriate to make a shape of the shim 5 to be produced a shape fitting the shape of the gap 4. Therefore, the shape of the shim 5 is a plate-like shape whose thickness is not constant.

Distances of the gap 4 that can be measured with a gap gauge are limited to distances of the gap 4 between the edge of the first mating surface 3A of the first component 2A and the edge of the second mating surface 3B of the second component 2B. Therefore, when the distances of the gap 4 between the edge of the first mating surface 3A of the first component 2A and the edge of the second mating surface 3B of the second component 2B are smaller than distances of the inside of the gap 4 as shown in (B) of FIG. 2, the shape of the shim 5 must be designed by predicting the distances of the inside of the gap 4.

When the production of the shim 5 is completed, the first mating surface 3A of the first component 2A is once separated from the second mating surface 3B of the second component 2B, as shown in (C) of FIG. 2. Note that, although the first mating surface 3A is separated from the second mating surface 3B by moving one or both of the first component 2A and the second component 2B in parallel together with one or both of the assembly jigs JA and JB, in the example shown in (C) of FIG. 2, the first mating surface 3A may be separated from the second mating surface 3B by removing one or both of the first component 2A and the second component 2B from one or both of the assembly jigs JA and JB, or removing one of the first component 2A and the second component 2B from the other component 2A or 2B.

When the first mating surface 3A of the first component 2A is separated from the second mating surface 3B of the second component 2B by a distance longer than at least the maximum thickness of the plate-shaped shim 5, the shim 5 can be disposed in accordance with the position of the gap 4, as shown in (C) of FIG. 2. For example, when one of the first component 2A and the second component 2B is disposed below, the shim 5 can be placed on the component 2A or 2B disposed below.

Next, the first component 2A and the second component 2B are positioned again, as shown in (D) of FIG. 2. That is, the first component 2A and the second component 2B can be positioned with the gap 4 filled with the shim 5. After that, the structure 1 can be produced by drilling necessary holes and coupling the first component 2A to the second component 2B with fasteners, such as bolts or rivets.

The structure 1 to be assembled by the steps shown in (A), (B), (C) and (D) of FIG. 2 can be produced by the producing method shown in FIG. 1. In the producing method shown in FIG. 1, the size of the gap 4 after positioning the first component 2A and the second component 2B to the coupling positions of the first component 2A and the second component 2B as shown in (B) of FIG. 2 is predicted, and then the first component 2A is coupled to the second component 2B with interposing the shim 5, produced according to the predicted size of the gap 4, between the first component 2A and the second component 2B as shown in (D) of FIG. 2.

Specifically, first in step S1, the first profile of the first mating surface 3A of the first component 2A with the second component 2B and the second profile of the second mating surface 3B of the second component 2B with the first component 2A are measured before the first component 2A and the second component 2B are positioned at the coupling positions, respectively. That is, the first profile on the first mating surface 3A of the first component 2A and the second profile on the second mating surface 3B of the second component 2B are each measured at the single product stage as shown in (A) of FIG. 2.

In addition, the third profile of the third surface 6A of at least a portion of the first component 2A that can be measured after completion of the positioning as shown in (B) of FIG. 2 and the fourth profile of the fourth surface 6B of at least a portion of the second component 2B that can be measured after completion of the positioning as shown in (B) of FIG. 2 are measured before the first component 2A and the second component 2B are positioned at the coupling positions, respectively. That is, the third profile on the third surface 6A of the first component 2A that can be measured after completing the positioning of the first component 2A and the fourth profile on the fourth surface 6B of the second component 2B that can be measured after completing the positioning of the second component 2B are also each measured at the single product stage as shown in (A) of FIG. 2.

The respective profiles of the first mating surface 3A, the second mating surface 3B, the third surface 6A and the fourth surface 6B can be measured with a known three-dimensional measuring machine. A typical contact-type three-dimensional measuring machine measures a surface profile by bringing a probe into contact with an object to be measured. On the other hand, a typical non-contact three-dimensional measuring machine measures a surface profile of an object to be measured by irradiation of light, such as a laser beam. The respective profiles of the first mating surface 3A, the second mating surface 3B, the third surface 6A and the fourth surface 6B can be each acquired as point group data on a surface defined by three-dimensional spatial coordinates by measurement using a three-dimensional measuring machine.

Note that, as long as there is no interference between a three-dimensional measuring machine and each of the first component 2A, the second component 2B and the assembly jigs JA and JB, a profile of at least one of the first mating surface 3A, the second mating surface 3B, the third surface 6A and the fourth surface 6B may be measured using the three-dimensional measuring machine after the positioning of one of the first component 2A and the second component 2B is completed. In other words, a profile of at least one of the first mating surface 3A, the second mating surface 3B, the third surface 6A and the fourth surface 6B can be measured using a three-dimensional measuring machine before the positioning of both the first component 2A and the second component 2B is completely completed as long as the profile can be measured. As a specific example, when the first component 2A is set and positioned in the assembly jig JA, and subsequently the second component 2B is positioned without moving the first component 2A, the respective profiles of the first mating surface 3A and the third surface 6A of the first component 2A can be measured after the positioning of the first component 2A is completed while the respective profiles of the second mating surface 3B and the fourth surface 6B of the second component 2B can be measured before the positioning of the second component 2B.

Next, in step S2, the first component 2A and the second component 2B are positioned at coupling positions. As a result, the first mating surface 3A of the first component 2A is butted against the second mating surface 3B of the second component 2B, as shown in (B) of FIG. 2. As described above, the positioning can be performed using positioning structures provided on at least one of the assembly jigs JA and JB, and the components 2A and 2B.

When the positioning of the first component 2A and the second component 2B is completed, the first component 2A and the second component 2B are deformed due to contact between the first component 2A and the second component 2B, attachment of the first component 2A and the second component 2B to the assembly jigs JA and JB, contact between one component 2A or 2B and the assembly jig JA or JB for setting the other component 2A or 2B, and the like. Further, the gap 4 is generated between the first mating surface 3A of the deformed first component 2A and the second mating surface 3B of the deformed second component 2B, as shown in (B) of FIG. 2, as described above.

Next, in step S3, a fifth profile on the third surface 6A of the positioned and deformed first component 2A in a state where the first mating surface 3A has been abutted against the second mating surface 3B, and a sixth profile on the fourth surface 6B of the positioned and deformed second component 2B in a state where the second mating surface 3B has been abutted against the first mating surface 3A are each measured using a three-dimensional measuring machine. That is, regarding the third surface 6A of the first component 2A and the fourth surface 6B of the second component 2B, the respective profiles are measured before and after the first component 2A and the second component 2B are deformed due to the positioning.

In this way, when the first profile on the first mating surface 3A of the first component 2A before the completion of the positioning, the second profile on the second mating surface 3B of the second component 2B before the completion of the positioning, the third profile on the third surface 6A of the first component 2A before the completion of the positioning, the fourth profile on the fourth surface 6B of the second component 2B before the completion of the positioning, the fifth profile on the third surface 6A of the first component 2A after the completion of the positioning, and the sixth profile on the fourth surface 6B of the second component 2B after the completion of the positioning have been measured, it becomes possible to calculate a seventh profile on on the first mating surface 3A of the first component 2A after the completion of the positioning, and an eighth profile on the second mating surface 3B of the second component 2B after the completion of the positioning, based on the measured first to sixth profiles.

Specifically, in step S4, the amounts of the deformation of the first component 2A and the second component 2B after the completion of the positioning are calculated based on the measured third to sixth profiles. More specifically, the amount of the deformation of the first component 2A is calculated based on the third profile of the third surface 6A of the first component 2A before the deformation and the fifth profile of the third surface 6A of the first component 2A after the deformation. Similarly, the amount of the deformation of the second component 2B is calculated based on the fourth profile of the fourth surface 6B of the second component 2B before the deformation and the sixth profile of the fourth surface 6B of the second component 2B after the deformation.

The amount of the deformation of the first component 2A can be calculated by subtracting point group data representing the third profile of the third surface 6A of the first component 2A before the deformation, from point group data representing the fifth profile of the third surface 6A of the first component 2A after the deformation, i.e., by subtraction of the pieces of the point group data at respective positions. Similarly, the amount of the deformation of the second component 2B can also be calculated by subtracting point group data representing the fourth profile of the fourth surface 6B of the second component 2B before the deformation, from point group data representing the sixth profile of the fourth surface 6B of the second component 2B after the deformation, i.e., by subtraction of the pieces of the point group data at respective positions. Therefore, each of the amount of the deformation of the first component 2A and the amount of the deformation of the second component 2B is calculated as point group data representing the amounts of the deformation at respective positions.

Note that, when profiles before and after the deformation of at least one cross section and/or at least one surface whose profile cannot be measured by a three-dimensional measuring machine due to interference or the like after completing the positioning of the first component 2A and the second component 2B are required to calculate the amounts of the deformation of the first component 2A and the second component 2B, an unmeasurable profile or unmeasurable profiles can be calculated by interpolation or extrapolation based on discrete measured profiles. Alternatively, one or both of the deformation amounts of the first component 2A and the second component 2B may be once calculated discretely based on the third to sixth profiles, and subsequently continuous and complete deformation amount or deformation amounts may be calculated by interpolation or extrapolation based on the calculated discrete deformation amounts.

When the shapes of the first component 2A and the second component 2B are complicated, the amounts of the deformation of the first component 2A and the second component 2B after the completion of the positioning may be calculated by a known analysis using the finite element method (FEM) or the like. In that case, in order to calculate the amounts of deformation of the first component 2A and the second component 2B after the completion of the positioning, the first profile of the first mating surface 3A of the first component 2A before the deformation and the second profile of the second mating surface 3B of the second component 2B before the deformation may be used.

Next, in step S5, the seventh profile on the first mating surface 3A of the first component 2A after the completion of the positioning and the eighth profile on the second mating surface 3B of the second component 2B after the completion of the positioning are calculated based on the first profile on the first mating surface 3A and the second profile on the second mating surface 3B, each measured before the completion of the positioning, as well as the deformation amounts of the first component 2A and the second component 2B.

The seventh profile on the first mating surface 3A of the first component 2A after the completion of the positioning can be calculated by adding the point group data representing the amounts of the deformation of the first component 2A to the point group data representing the first profile on the first mating surface 3A measured before the completion of the positioning. Similarly, the eighth profile on the second mating surface 3B of the second component 2B after the completion of the positioning can be calculated by adding the point group data representing the amounts of the deformation of the second component 2B to the point group data representing the second profile on the second mating surface 3B measured before the completion of the positioning.

Note that, in a case where profiles before and after the deformation on at least one cross section and/or at least one surface whose profile cannot be measured by a three-dimensional measuring machine due to interference or the like after completing the positioning of the first component 2A and the second component 2B are required to calculate the amounts of the deformation of the first component 2A and the second component 2B, targets of the interpolation processing or extrapolation processing may not be the third to sixth profiles on the third surface 6A of the first component 2A and the fourth surface 6B of the second component 2B, or the deformation amounts of the first component 2A and the second component 2B, but may be the seventh profile on the first mating surface 3A of the first component 2A after the completion of the positioning and the eighth profile on the second mating surface 3B of the second component 2B after the completion of the positioning.

Next, in step S6, the size of the gap 4 between the first component 2A after the completion of the positioning and the second component 2B after the completion of the positioning is calculated based on the seventh profile on the first mating surface 3A of the first component 2A after the completion of the positioning and the eighth profile on the second mating surface 3B of the second component 2B after the completion of the positioning.

The size of the gap 4 can be calculated by subtraction processing between the point group data representing the seventh profile on the first mating surface 3A of the first component 2A after the completion of the positioning and the point cloud data representing the eighth profile on the second mating surface 3B of the second component 2B after the completion of the positioning. That is, the size of the gap 4 can be calculated as distances at respective positions between the first mating surface 3A of the first component 2A after the completion of the positioning and the second mating surface 3B of the second component 2B after the completion of the positioning.

In this way, as long as the first profile on the first mating surface 3A of the first component 2A before the completion of the positioning, the second profile on the second mating surface 3B of the second component 2B before the completion of the positioning, the third profile on the third surface 6A of the first component 2A before the completion of the positioning, the fourth profile on the fourth surface 6B of the second component 2B before the completion of the positioning, the fifth profile on the third surface 6A of the first component 2A after the completion of the positioning and the sixth profile on the fourth surface 6B of the second component 2B after the completion of the positioning are measured, the size of the gap 4 can be calculated based on the measured first to sixth profiles.

Note that, in a case where profiles before and after the deformation on at least one cross section and/or at least one surface whose profile cannot be measured by a three-dimensional measuring machine due to interference or the like after completing the positioning of the first component 2A and the second component 2B are required to calculate the amounts of the deformation of the first component 2A and the second component 2B, a target of the interpolation processing or extrapolation processing may be the size of the gap 4. In that case, pieces of intermediate data, such as the amounts of deformation and profiles of the first component 2A and the second component 2B, for calculating the size of the gap 4 can be treated as pieces of discrete data.

When analysis processing, such as FEM analysis, is performed as mentioned above, the output data of the analysis processing may be the seventh profile on the first mating surface 3A of the first component 2A after the completion of the positioning and the eighth profile on the second mating surface 3B of the second component 2B after the completion of the positioning, or the size of the gap 4, instead of the respective deformation amounts of the first component 2A and the second component 2B.

Next, in step S7, the shim 5 is produced based on the calculated size of the gap 4. That is, the shape of the shim 5 is designed to fit the calculated shape of the gap 4, and then the shim 5 having the shape that fits the calculated shape of the gap 4 is produced.

The material of the shim 5 is generally determined as a design requirement for the structure 1. The material of the shim 5 is not necessarily the same as one of the materials of the first component 2A and the second component 2B. In many cases, the shim 5 is made of a metal, such as aluminum, or an FRP (fiber reinforced plastic), such as GFRP (glass fiber reinforced plastic) or CFRP (carbon fiber reinforced plastic), which is also called a composite material. Note that, the materials of the first component 2A and the second component 2B also include a metal, such as aluminum, or an FRP in many cases.

The shim 5 can be produced by a desired producing method, such as machining or polishing, depending on the material, based on design information corresponding to the calculated size of the gap 4. That is, the shim 5 can be produced based only on the calculated size of the gap 4 without necessarily measuring distances between the first mating surface 3A of the first component 2A after the completion of the positioning and the second mating surface 3B of the second component 2B after the completion of the positioning using a gap gauge. Nevertheless, distances between the first mating surface 3A of the first component 2A after the completion of the positioning and the second mating surface 3B of the second component 2B after the completion of the positioning may be measured using a gap gauge in order to confirm the accuracy of the calculated size of the gap 4. In that case, offset correction of the calculated size of the gap 4 may be performed according to distances measured by a gap gauge, as necessary.

Next, in step S8, the first component 2A is coupled to the second component 2B with the first component 2A and the second component 2B positioned by inserting the shim 5 into the gap 4 between the first component 2A and the second component 2B. Specifically, at least one of the first component 2A and the second component 2B is once separated from the other so that the shim 5 can be inserted between the first component 2A and the second component 2B as shown in (C) of FIG. 2. After that, the first component 2A and the second component 2B are positioned again with the shim 5 placed at the position where the gap 4 is formed. In this way, the first component 2A and the second component 2B can be positioned with the shim 5 inserted into the gap 4 as shown in (D) of FIG. 2.

When the positioning of the first component 2A and the second component 2B is completed, necessary holes are drilled with a hand drill or the like. After that, the first component 2A is coupled to the second component 2B with fasteners, such as bolts or rivets. When the first component 2A and the second component 2B have been coupled to each other with fasteners at coupling positions, the assembly work of the structure 1 is completed. That is, the structure 1 can be produced.

Next, a specific example of the structure 1 that can be produced by the producing method shown in FIG. 1 will be described.

Figure 3:
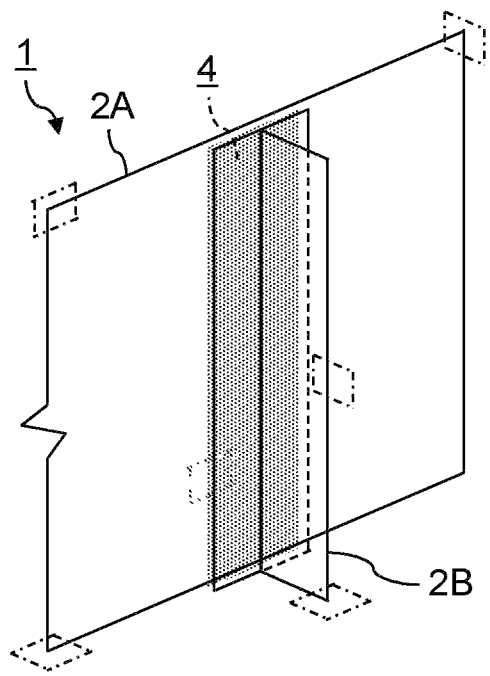
FIG. 3 is a perspective view showing the first example of the structure to be produced by the producing method shown in FIG. 1.

FIG. 3 is a perspective view showing the first example of the structure 1 to be produced by the producing method shown in FIG. 1.

The producing method shown in FIG. 1 can be adopted in a case of assembling the structure 1 by coupling the second part 2B consisting of a reinforcing member, such as a stringer, a spar, a rib, a frame or a stiffener, having an elongated structure to the first component 2A consisting of a panel or a part having a web with fasteners, as illustrated in FIG. 3. The part having the web may be a reinforcing member, such as a spar. Therefore, the producing method shown in FIG. 1 can also be adopted in a case of assembling the structure 1 by coupling a reinforcing member to a web of another reinforcing member for reinforcing a panel. As a matter of course, each reinforcing member may have a desired cross-sectional shape.

In this case, the gap 4 formed between a mating surface of the reinforcing member and a surface of the panel or web is the calculation target of the size and the insertion target of the shim 5. Note that, the dashed-dotted lines in FIG. 3 indicate respective planes in three orthogonal axes directions to which the reinforcing member and the panel or web should be positioned using the assembly jigs JA and JB and/or a surface or surfaces of the panel or web.

Figure 4:
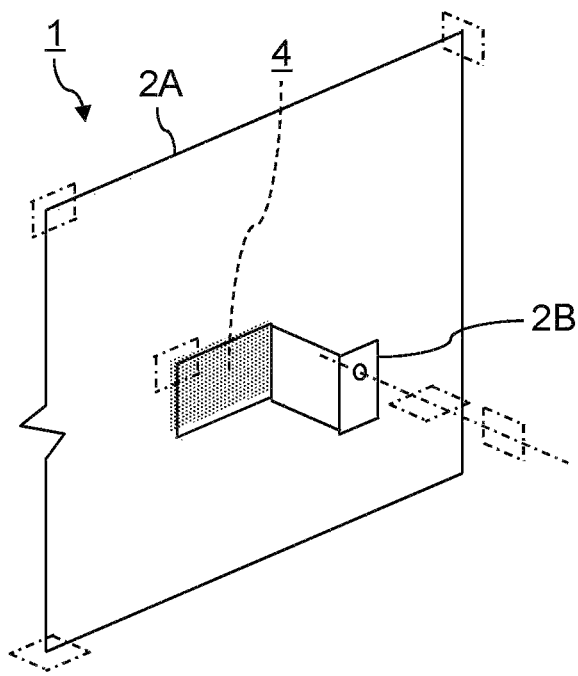
FIG. 4 is a perspective view showing the second example of the structure to be produced by the producing method shown in FIG. 1.

FIG. 4 is a perspective view showing the second example of the structure 1 to be produced by the producing method shown in FIG. 1.

The producing method shown in FIG. 1 can also be adopted in a case of assembling the structure 1 by coupling the second part 2B consisting of a fitting to the first component 2A consisting of a panel or a part having a web with fasteners, as illustrated in FIG. 4.

In this case, the gap 4 formed between a mating surface of the fitting and a surface of the panel or web is the calculation target of the size and the insertion target of the shim 5. Note that, the dashed-dotted lines in FIG. 4 indicate respective planes in three orthogonal axes directions to which the fitting and the panel or web should be positioned using the assembly jigs JA and JB including a positioning pin, and/or a surface or surfaces of the panel or web.

Figure 5:
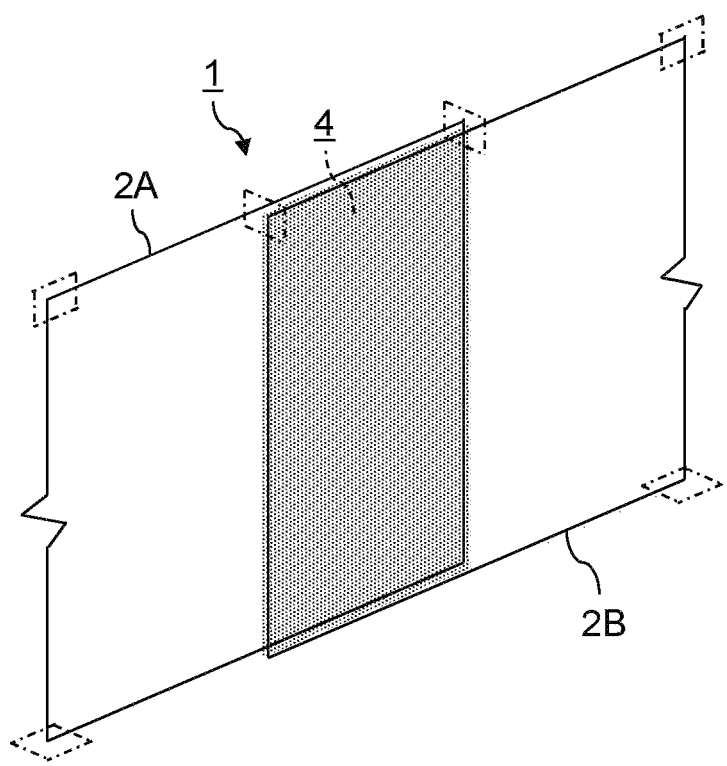
FIG. 5 is a perspective view showing the third example of the structure to be produced by the producing method shown in FIG. 1.

FIG. 5 is a perspective view showing the third example of the structure 1 to be produced by the producing method shown in FIG. 1.

As illustrated in FIG. 5, the first component 2A may be a panel or part having a web while the second component 2B may be another panel or part having a web. That is, the producing method shown in FIG. 1 can also be adopted in a case of assembling the structure 1 by coupling one panel or web to another panel or web with fasteners.

In this case, the gap 4 formed between a surface of the first panel or web and a surface of the second panel or web is the calculation target of the size and the insertion target of the shim 5. Note that, the dashed-dotted lines in FIG. 5 indicate respective planes in three orthogonal axes directions to which the two panels or webs should be positioned using the assembly jigs JA and JB, and the like.

In the above-mentioned method of producing the structure 1, measurable surface profiles of the first component 2A and the second component 2B of which the structure 1 is composed are measured before and after deformation due to positioning of the first component 2A and the second component 2B, and then the size of the gap 4 that arises between the first component 2A and the second component 2B after the positioning is calculated based on the measured profiles.

Effects

According to the above-mentioned method of producing the structure 1, the size of the entire gap 4 formed between the first component 2A and the second component 2B, which has been difficult to be measured with a gap gauge in the past, can be obtained with high precision. Accordingly, it is possible to produce the shim 5 so as to have such an appropriate shape that fits the gap 4. As a result, it is possible to avoid deterioration in the quality of the structure due to a small gap remaining inside the structure, and to avoid delay in producing the structure due to remaking another shim when a produced shim does not fit the gap.

In addition, it is possible to eliminate the need to measure the gap 4 at edge portions of the first component 2A and the second component 2B using a gap gauge. Accordingly, various restrictions for allowing the gap to be measured with a gap gauge can be eliminated. As a specific example, it is possible to eliminate the need to design assembly jigs and the like with consideration for interference avoidance so that the gap can be measured with a gap gauge.

Other Implementations

While certain implementations have been described, these implementations have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A method of producing a structure by coupling a first component to a second component and inserting a shim into a gap formed between the first component and the second component, the structure consisting of an aircraft, an aircraft component, a spacecraft or a spacecraft component, the method comprising:

measuring a first profile of a first surface of the first component before completing positioning of the first component and the second component to coupling positions of the first component and the second component, the first surface being to be mated with the second component;

measuring a second profile of a second surface of the second component before completing the positioning, the second surface being to be mated with the first component;

measuring a third profile of a third surface of the first component before completing the positioning, the third surface being measurable after completing the positioning;

measuring a fourth profile of a fourth surface of the second component before completing the positioning, the fourth surface being measurable after completing the positioning;

performing the positioning by butting the first and second components such that the first surface physically abuts against the second surface;

measuring a fifth profile of the third surface after completing the positioning;

measuring a sixth profile of the fourth surface after completing the positioning;

calculating a size of the gap based on the measured first to sixth profiles;

producing the shim based on the calculated size of the gap; and coupling the second component to the first component in a state where the shim has been inserted into the gap and the positioning has been completed, wherein a seventh profile of the first surface after completing the positioning and an eighth profile of the second surface after completing the positioning are calculated based on the measured first to sixth profiles, and the size of the gap is calculated based on the calculated seventh and eighth profiles, and wherein amounts of deformation of the first component and the second component after completing the positioning are calculated based on the measured third to sixth profiles, and the seventh profile of the first surface after completing the positioning and the eighth profile of the second surface after completing the positioning are calculated based on the calculated amounts of the deformation, and the first and second profiles measured before completing the positioning.

2. The method of producing the structure according to claim 1, wherein the shim is produced based on the calculated size of the gap without measuring any distance between the first surface after completing the positioning and the second surface after completing the positioning with a clearance gauge.

3. The method of producing the structure according to claim 1, wherein the first component includes a first panel, or a first part having a first web, and the second component includes a reinforcement, a fitting, a second panel, or a second part having a second web.

4. The method of producing the structure according to claim 2, wherein the first component includes a first panel, or a first part having a first web, and the second component includes a reinforcement, a fitting, a second panel, or a second part having a second web.

* * * * *